(12) United States Patent
Clarridge et al.

(10) Patent No.: US 7,248,058 B2
(45) Date of Patent: Jul. 24, 2007

(54) TESTING AND CALIBRATION DEVICE WITH DIAGNOSTICS

(76) Inventors: Ronald P. Clarridge, 15 Claridge Cir., Webster, NY (US) 14580; Gerald T. Allen, Jr., 3 Christy Pkwy., Honeoye Falls, NY (US) 14472

( * ) Notice: Subject to any disclaimer, the term of this patent is extended or adjusted under 35 U.S.C. 154(b) by 55 days.

(21) Appl. No.: 10/968,615

(22) Filed: Oct. 18, 2004

(65) Prior Publication Data
US 2005/0083068 A1  Apr. 21, 2005

Related U.S. Application Data

(60) Provisional application No. 60/512,597, filed on Oct. 17, 2003.

(51) Int. Cl.
*G01R 35/00* (2006.01)
*G01R 1/02* (2006.01)

(52) U.S. Cl. ........................ 324/601; 324/130

(58) Field of Classification Search ................ 324/601, 324/600, 74, 130, 202, 523, 527, 533, 76.11, 324/158.1; 702/108, 122
See application file for complete search history.

(56) References Cited

U.S. PATENT DOCUMENTS

| | | | | |
|---|---|---|---|---|
| 4,853,613 A * | 8/1989 | Sequeira et al. | ............ | 324/601 |
| 5,703,489 A * | 12/1997 | Kuroe | ........................ | 324/601 |
| 6,421,624 B1 * | 7/2002 | Nakayama et al. | ......... | 702/117 |
| 6,671,222 B2 * | 12/2003 | Wilson et al. | ................ | 367/13 |
| 6,958,598 B2 * | 10/2005 | Xu | ........................... | 324/158.1 |
| 6,990,423 B2 * | 1/2006 | Brown et al. | ............... | 702/117 |
| 2003/0115517 A1 * | 6/2003 | Rutten | ........................ | 714/718 |

* cited by examiner

*Primary Examiner*—Andrew H. Hirshfeld
*Assistant Examiner*—Hoai-An D. Nguyen
(74) *Attorney, Agent, or Firm*—Michael J. Nickerson; Basch & Nickerson LLP

(57) ABSTRACT

A testing device for determines values of various electrical variables associated with a device within a process system. The testing device provides bi-directional electrical communication with a device to be monitored and automatically provides a connection configuration between a processing unit and a set of input/output ports. The connection configuration governs a bi-directional flow of electrical signals between the processing unit and the device to be monitored. The processing unit outputs a test signal and a configuration control signal to the input/output port control circuitry. The input/output port control circuitry, in response to received test and configuration control signals, automatically provides a connection configuration to direct the test signal to the device to be monitored and to direct a return signal, the return signal being generated by the monitored device in response to the test signal, to the processing unit. The processing unit, based upon the connection configuration of the input/output port control circuitry, measures an electrical characteristic of the return signal and determines at least two electrical variables associated with the monitored device based upon the measured electrical characteristic of the return signal generated by the monitored device.

32 Claims, 18 Drawing Sheets

US 7,248,058 B2

TESTING AND CALIBRATION DEVICE WITH DIAGNOSTICS

PRIORITY INFORMATION

This application claims priority from U.S. Provisional Patent Application, Ser. No. 60/512,597, filed on Oct. 17, 2003. The entire content of U.S. Provisional Patent Application, Ser. No. 60/512,597 is hereby incorporated by reference.

FIELD OF THE PRESENT INVENTION

The present invention relates generally to calibration equipment for the process industry. More specifically, the present invention is directed to a single integrated calibrator that provides process calibration along with loop diagnostics.

BACKGROUND OF THE PRESENT INVENTION

Conventionally, handheld process calibration equipment showed the primary variable being tested. As an example, a conventional 4–20 mA calibrator shows the current output or reading. This may be scaled in mA or percentage of the 4–20 mA span.

Moreover, conventional calibrators may show error enunciators such as "overload," "over-current," "ERROR" etc. While these enunciators may indicate that there is an error, the conventional calibrators fail to supply sufficient information to determine the source of the error.

For example, with conventional portable calibration equipment when the calibrator shows an "ERROR," the user would have to pull out a number of test instruments to determine the actual source of the error. These instruments would typically have to be carried into the "field." Thus, the user may have to carry the device, and all the accompanying instruments, long distances, possibly up ladders, or to very remote locations. Usually, the accompanying equipment includes a digital multi-meter, power supplies, decade boxes, etc. These devices would have to be hooked up with or in place of the conventional calibrator to determine the actual error source; i.e., the circuit had no supply voltage, the circuit had high impedance, or a component was leaking current.

In addition to additional equipment, these troubleshooting connections may be complicated. Moreover, the troubleshooting routines typically have difficulty monitoring "dynamic" changes within the "normal" operating conditions, as well as, fail to provide any "logging" capabilities.

Conventionally, transient out of normal conditions are monitored manually one variable at a time or the user has to watch for the error condition to occur. This is very time consuming and error prone.

To better understand the problems associated with conventional calibrators, a discussion of FIGS. 1 and 2 will be provided below.

As illustrated in FIG. 1, a process loop includes a calibrated digital control source 10 connected to a field transmitter 20 through communication channel 25, in this example, a pair of wires. As shown, a 20 mA signal is sent from the calibrated digital control source 10 to a field transmitter 20 for calibration purposes, but due to a remote fault or corroded connections, the amperage amplitude of the signal received by the field transmitter 20 is reduced, by a leakage current $i_{Leakage}$, shown as flowing through a leakage resistance. In response thereof, the field transmitter 20 produces a return signal for the calibrated digital control source 10 wherein this return signal has amperage amplitude of 20 mA minus $i_{leakage}$. The return signal is combined with the leakage current, $i_{Leakage}$, to create a signal having amperage amplitude of 20 mA. The actual amperage amplitude of the signal received by the calibrated digital control source 10 is shown on display 11. Thus, in this system, an undetected calibration error is realized because the actual amperage amplitude of the signal received by the field transmitter 20 is 20 mA minus $i_{Leakage}$, but the actual amperage amplitude of the signal received by the calibrated digital control source 10 is 20 mA, as shown on display 11. Thus, the operator is unaware that a fault has occurred.

FIG. 2 illustrates another example of this problem. As illustrated in FIG. 2, a process loop includes a portable calibrated digital control source 30 connected to a field transmitter 20 through communication channel 25, in this example, a pair of wires. As shown, a 20 mA signal is sent from the portable calibrated digital control source 30 to a field transmitter 20 for calibration purposes, but due to a remote fault or corroded connections, the amperage amplitude of the signal received by the field transmitter 20 is reduced, by a leakage current $i_{Leakage}$, shown as flowing through a leakage resistance. In response thereof, the field transmitter 20 produces a return signal for the portable calibrated digital control source 30 wherein this return signal has amperage amplitude of 20 mA minus $i_{Leakage}$. The return signal is combined with the leakage current, $i_{Leakage}$, to create a signal having amperage amplitude of 20 mA. The actual amperage amplitude of the signal received by the portable calibrated digital control source 30 is shown on display 31. Thus, in this system, an undetected calibration error is realized because the actual amperage amplitude of the signal received by the field transmitter 20 is 20 mA minus $i_{Leakage}$, but the actual amperage amplitude of the signal received by the portable calibrated digital control source 30 is 20 mA, as shown on display 31. Thus, the operator is unaware that a fault has occurred.

Therefore, it is desirable to provide a device that is capable of monitoring and displaying additional information (variables) in one or more concise screens. It is also desirable to provide a device that is capable of indicating on the display the most likely cause of error as compared to normal operating conditions, more specifically, capable of highlighting the "non-primary" variable(s) that is out of the normal range or condition, thereby allowing the user on one screen to identify and troubleshoot.

It is further desirable to provide a device that is capable of easily monitoring "dynamic" changes within the "normal" operating conditions. Furthermore, it is also desirable to provide a device that is capable of logging conditions to enable monitoring for transient out of normal conditions. In addition, it is also desirable to provide a device that is capable of testing with the lowest common denominator of connections required.

Moreover, it is also desirable to provide a device that is capable of eliminating the need for digital multi-meters in the industry specific calibration processes and supply such information without requiring several different connection schemes to acquire if at all.

Lastly, it is also desirable to provide a calibration capable of producing the unknown variables of Current, Voltage (AC, DC), Resistance, Capacitance and Inductance so as to enable concurrent measurement and display of the various variables without requiring disconnection and reconnection when, for example, a current measurement is required and a voltage reading is required, thereby allowing the diagnostics of multiple variables with a single connection scheme.

SUMMARY OF THE PRESENT INVENTION

One aspect of the present invention is a testing device for determining values of various electrical variables associated with a device within a process system. The testing device includes a set of input/output ports to provide bi-directional electrical communication with a device to be monitored; a processing unit; and input/output port control circuitry, operatively connected to the set of input/output ports and the processing unit, to automatically provide a connection configuration between the processing unit and the set of input/output ports, the connection configuration governing a bi-directional flow of electrical signals between the processing unit and the device to be monitored. The processing unit outputs a test signal and a configuration control signal to the input/output port control circuitry. The input/output port control circuitry, in response to received test and configuration control signals, automatically provides a connection configuration to direct the test signal to the device to be monitored and to direct a return signal, the return signal being generated by the monitored device in response to the test signal, to the processing unit. The processing unit, based upon the connection configuration of the input/output port control circuitry, measures an electrical characteristic of the return signal and determines at least two electrical variables associated with the monitored device based upon the measured electrical characteristic of the return signal generated by the monitored device.

A second aspect of the present invention is a method, using a testing device, for determining values of various electrical variables associated with a device within a process system. The method provides, through input/output ports, bi-directional electrical communication with a device to be monitored; automatically provides a connection configuration between a processing unit of the testing device and the device to be monitored, the connection configuration governing a bi-directional flow of electrical signals, through input/output ports, between the processing unit and the device to be monitored; outputs a test signal; receives a return signal generated by the monitored device in response to the test signal; and measures an electrical characteristic of the return signal and determining at least two electrical variables associated with the monitored device based upon the measured electrical characteristic of the return signal generated by the monitored device.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
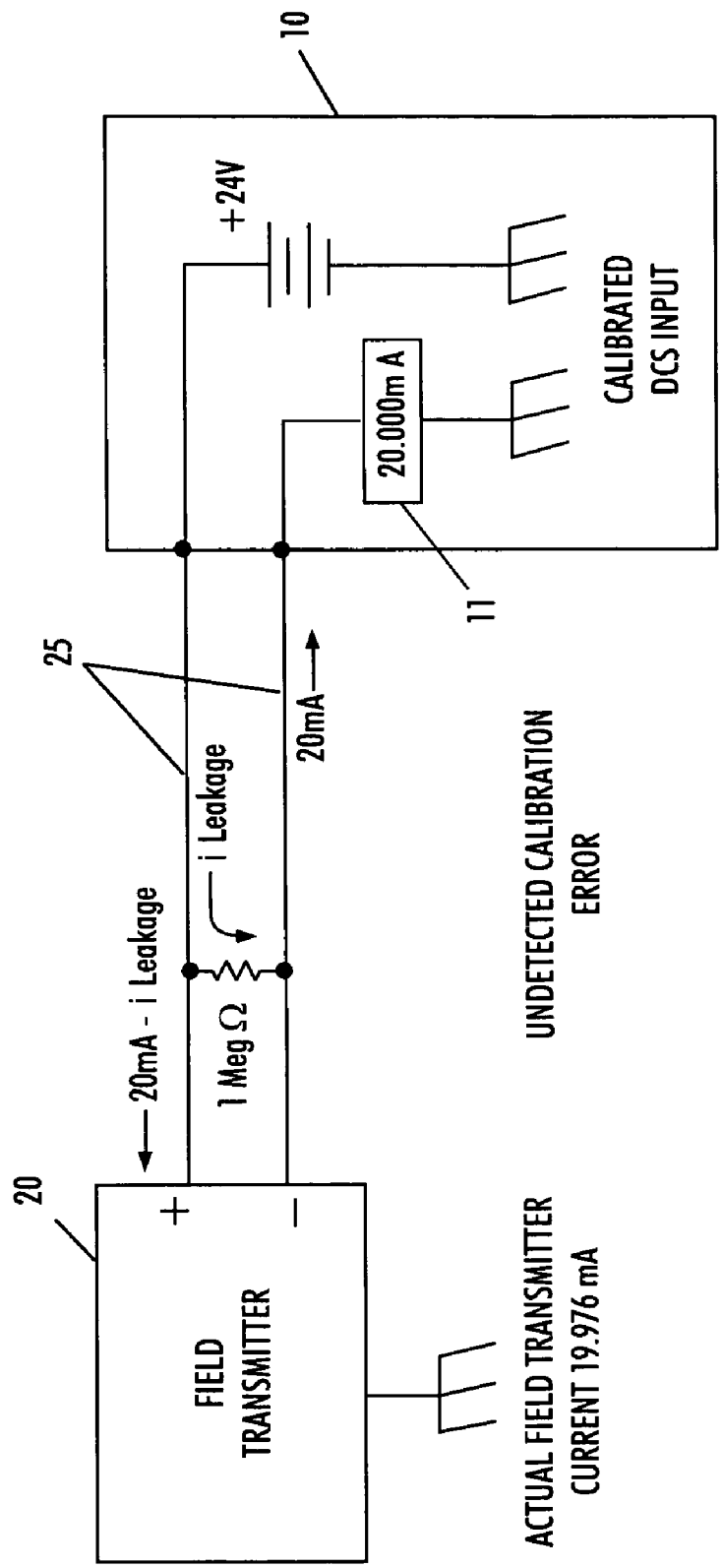
FIG. 1 illustrates a conventional calibration system.
Figure 2:
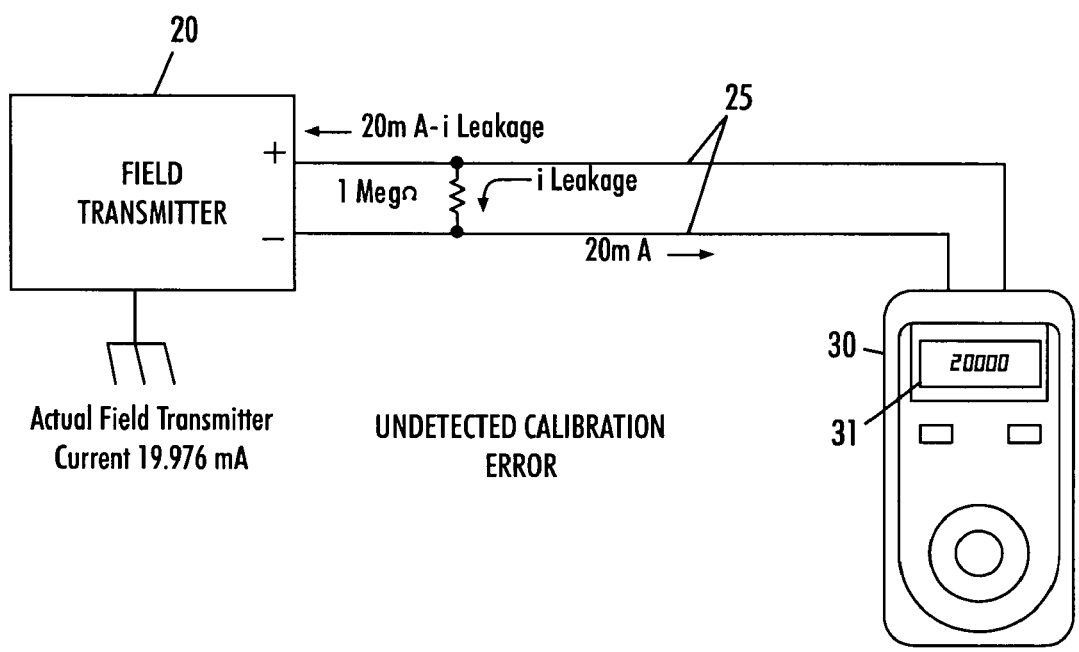
FIG. 2 illustrates another example of a conventional calibration system.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

With regards to the conventional devices, the present invention is capable of monitoring and displaying additional information (variables) in one or more concise screens. (See FIGS. 5 through 10). The present invention also indicates on a display the most likely cause of error as compared to normal operating conditions. In that circumstance, one embodiment of the present invention will highlight the "non-primary" variable(s) that is (are) out of the normal range or condition. This allows the user on one screen to identify and troubleshoot, thereby saving significant time.

In addition, another embodiment of the present invention logs conditions monitoring for transient out of normal conditions that would normally have to be monitored manually. This embodiment would show multiple variables and a time stamp or other means of error tracking to help the user in troubleshooting and test of process loops over long periods of time.

Another feature of the present invention is that the present invention does testing with the lowest common denominator of connections required. Most of the measurements, noted above, can be made by the present invention with a very simple two-wire connection. For example, using a simple two-wire connection, the present invention can monitor current supplied, load impedance, and AC and DC voltage presence.

Figure 3:
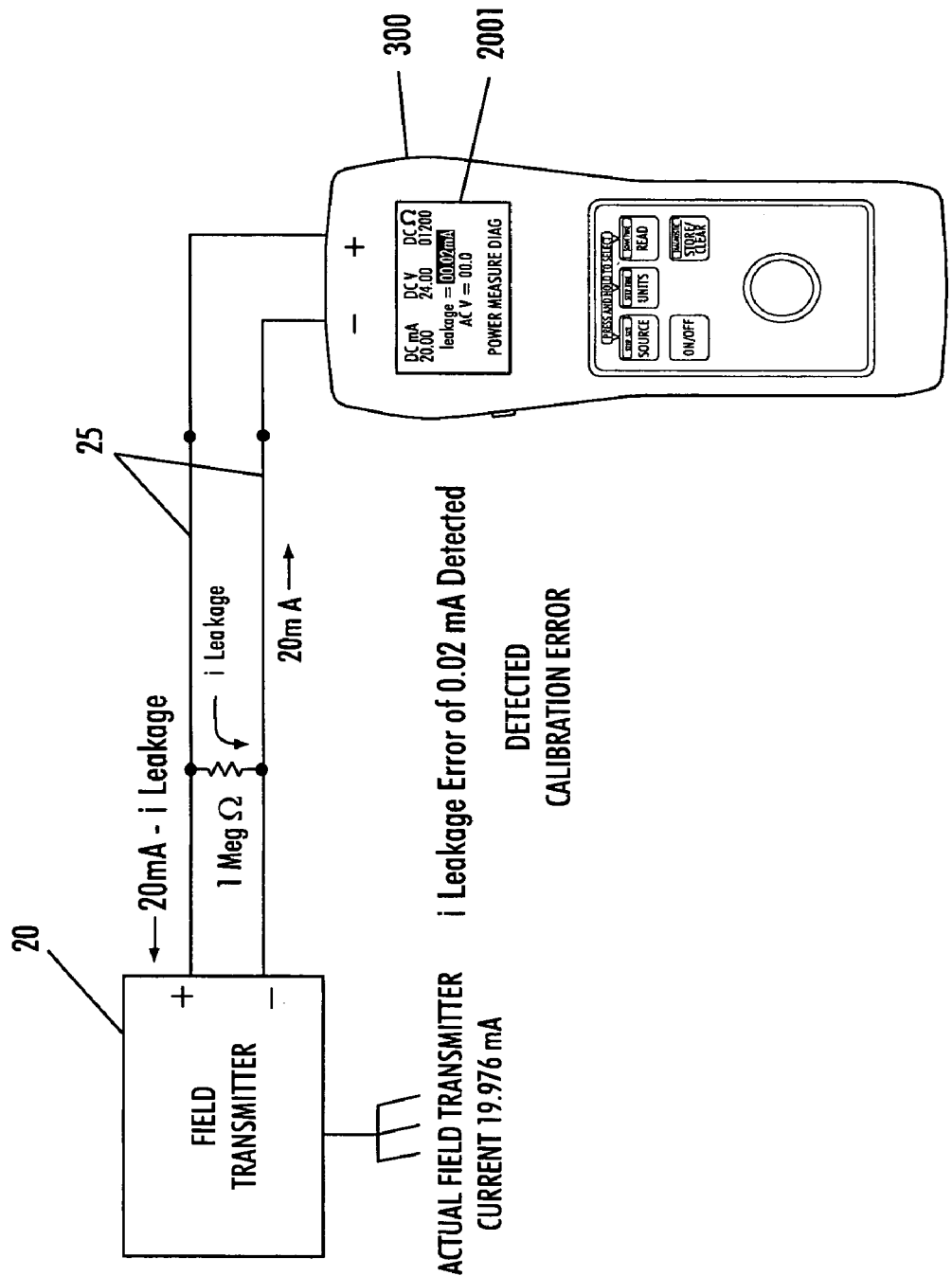
FIG. 3 illustrates a calibration system according to the concepts of the present invention.

FIG. 3 illustrates a simple embodiment of the concepts of the present invention. As illustrated in FIG. 3, a field transmitter 20 is to be calibrated. A portable process calibrator 300, according to the concepts of the present invention, is connected to the field transmitter 20 via a communication channel 25, in this example, a pair of wires. As shown, a 20 mA signal is sent from the portable process calibrator 300 to the field transmitter 20 for calibration purposes, but due to a remote fault or corroded connections, the amperage amplitude of the signal received by the field transmitter 20 is reduced, by a leakage current $i_{Leakage}$, shown as flowing through a leakage resistance.

In response thereof, the field transmitter 20 produces a return signal for the portable process calibrator 300 wherein this return signal has amperage amplitude of 20 mA minus $i_{Leakage}$. The return signal is combined with the leakage current, $i_{Leakage}$, to create a signal having amperage amplitude of 20 mA. The actual amperage amplitude of the signal received by the portable process calibrator 300 is shown on display 2001. Unlike the conventional devices, in this system, a calibration error is detected and displayed on display 2001. The actual process of detecting this leakage current will be explained in more detail below.

Thus, the operator is fully aware that a fault has occurred. In this embodiment, the fault is highlighted by the display 2001 to further alert the user of the error.

Figure 4:
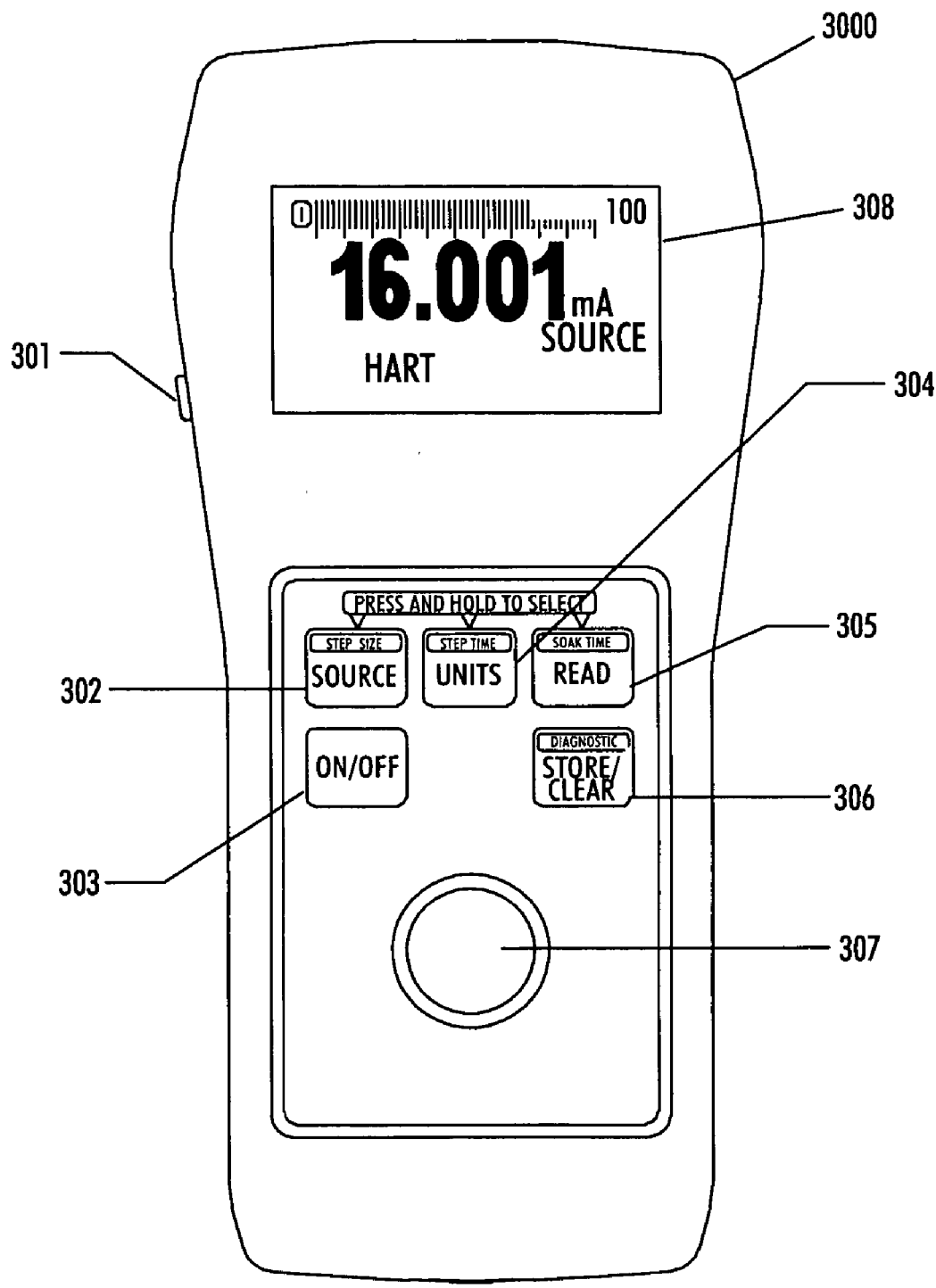
FIG. 4 illustrates a portable process calibrator according to the concepts of the present invention.

FIG. 4 illustrates a portable process calibrator 3000, according to the concepts of the present invention. As shown, the portable process calibrator 3000 includes a check switch/step pushbutton 301. The check switch/step pushbutton 301, via a sliding action, allows the user to select user-stored values for calibration points. The check switch/step pushbutton 301, via a press and release action, allows the user to adjust the output by user defined step size. Lastly, check switch/step pushbutton 301, via a press and hold action, allows the user to activate an auto step/ramp mode.

The portable process calibrator 3000 also includes a source/step size button 302 and an ON/Off button 303. The source/step size button 302, via a press and release action, allows the user to change source modes: Source Milliamps; 2-Wire Transmitter Simulate; and Source Volts. The source/step size button 302, via a press and hold action, allows the user to change step size.

The portable process calibrator 3000 further includes a units/step time button 304. The units/step time button 304, via a press and release action, allows the user to change how current is displayed: preferably either in milliamps or % of 4–20 mA. It is noted that voltage is only displayed in volts. The units/step time button 304, via a press and hold action, allows the user to change step size.

The portable process calibrator 3000 further includes a read/soak time button 305. The read/soak time button 305, via a press and release action, allows the user to change between read modes: Read Milliamps; Power and Measure 2-Wire Transmitter; and Read Volts. The read/soak time button 305, via a press and hold action, allows the user to change soak time.

Furthermore, the portable process calibrator 3000 further includes a store/clear/diagnostic button 306. The store/clear/diagnostic button 306, via a press and release action when in any source mode, allows the user to save the current reading. The display 308 will flash "STORED" to confirm. The store/clear/diagnostic button 306, via a press and release action when in any read mode, allows the user to clear the saved reading. The display 308 will flash "CLEARED" to confirm. The store/clear/diagnostic button 306, via a press and hold action, allows the user to activate a diagnostic mode that will be explained in more detail below.

Figure 11:
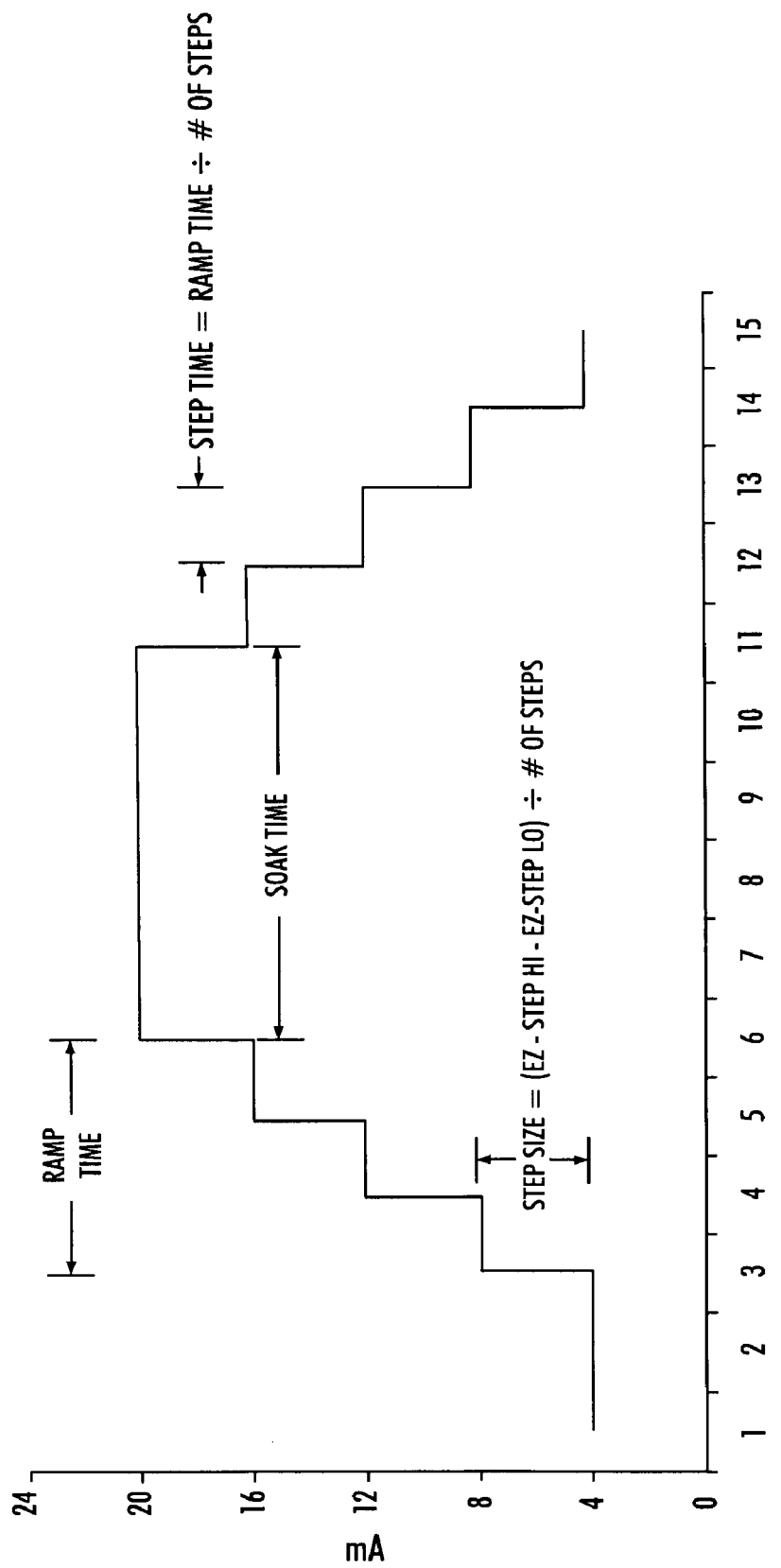
FIG. 11 shows an automatic stepping/ramping signal.

Each of the adjustments, mentioned above, is illustrated in FIG. 11. FIG. 11 shows an automatic stepping/ramping signal wherein the parameters of ramp time, step size, soak time, and step time can be adjusted by the present invention.

Lastly, the portable process calibrator 3000 further includes a dial 307. The knob 307 can be turned to adjust the output level or pressed and turned to adjust 100× faster. The knob 307 also allows the user to enter into a configuration mode.

By pressing knob 307 while turning the portable process calibrator 3000 ON, the configuration mode is accessed. Upon entering the configuration mode, turning knob 307 allows the user to select configuration items, whereas, pressing knob 307 allows the user to change configuration items. Turning portable process calibrator 3000 OFF or waiting approximately 8 seconds exits the configuration mode.

In the configuration mode, AUTO OFF can be set so as to save battery life by turning the unit off after 30 minutes of inactivity. The present invention can also be configured to allow manual and automatic stepping/ramping to be available or to operate in a HART® compatibility mode. This mode is useful when the devices being powered, communicate using the HART® protocol. In this mode, the portable process calibrator 3000 connects a 250 Ω load resistor in series with the output in both Source and Power Measure 2-Wire transmitter modes. This eliminates the requirement of an external 250 Ω load resistor.

The present invention also has a configurable option of allowing the highest and lowest readings to be automatically saved or that the current reading will show.

Figure 5:
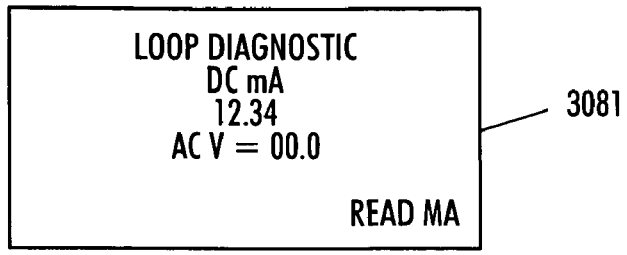
FIGS. 5–7 illustrate the various displays for the various read modes according to the concepts of the present invention.

As illustrated in FIG. 5, display 3081 will display the measured characteristics of the loop current when the read mode is read milliamps. This mode of operation is illustrated in FIG. 13.

Figure 13:
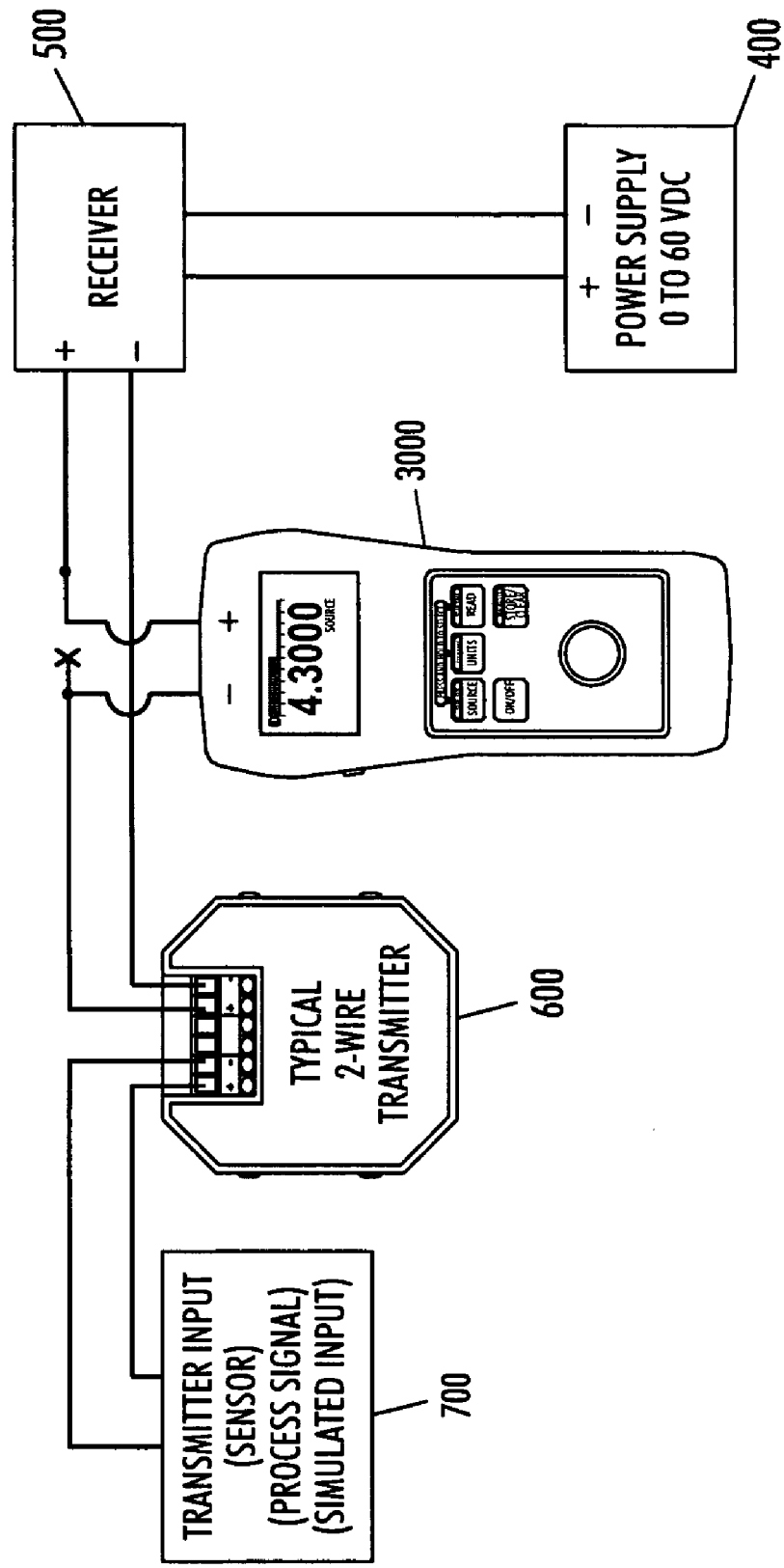
FIG. 13 illustrates wiring configuration for calibrating using the portable process calibrator in the read milliamp mode according to the concepts of the present invention.

As illustrated in FIG. 13, a process loop includes a power source 400, a receiver 500, a two-wire transmitter 600, and a transmitter input 700, such as a sensor, process signal, or simulated input. To read the milliamps of the process loop, a break in the connection between an output of the receiver 500 and an input to the two-wire transmitter 600 is created. The portable process calibrator 3000 is connected between this break so as to complete the circuit path while allowing the portable process calibrator 3000 to measure the current. It is noted that current limiting above 24 mA is indicated on the display 3081 by a flashing "CURRENT LIMITED."

Figure 6:
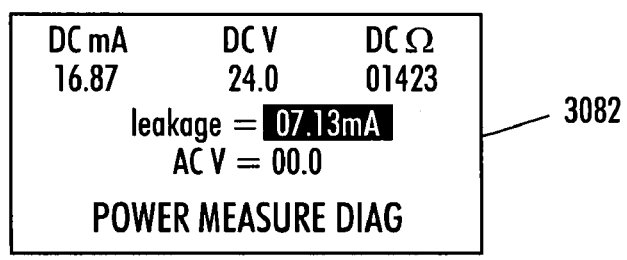

As illustrated in FIG. 6, display 3082 will display the measured characteristics of the loop current, voltage, and resistance when the read mode is power and measure two-wire transmitter. This mode of operation is illustrated in FIG. 14.

Figure 14:
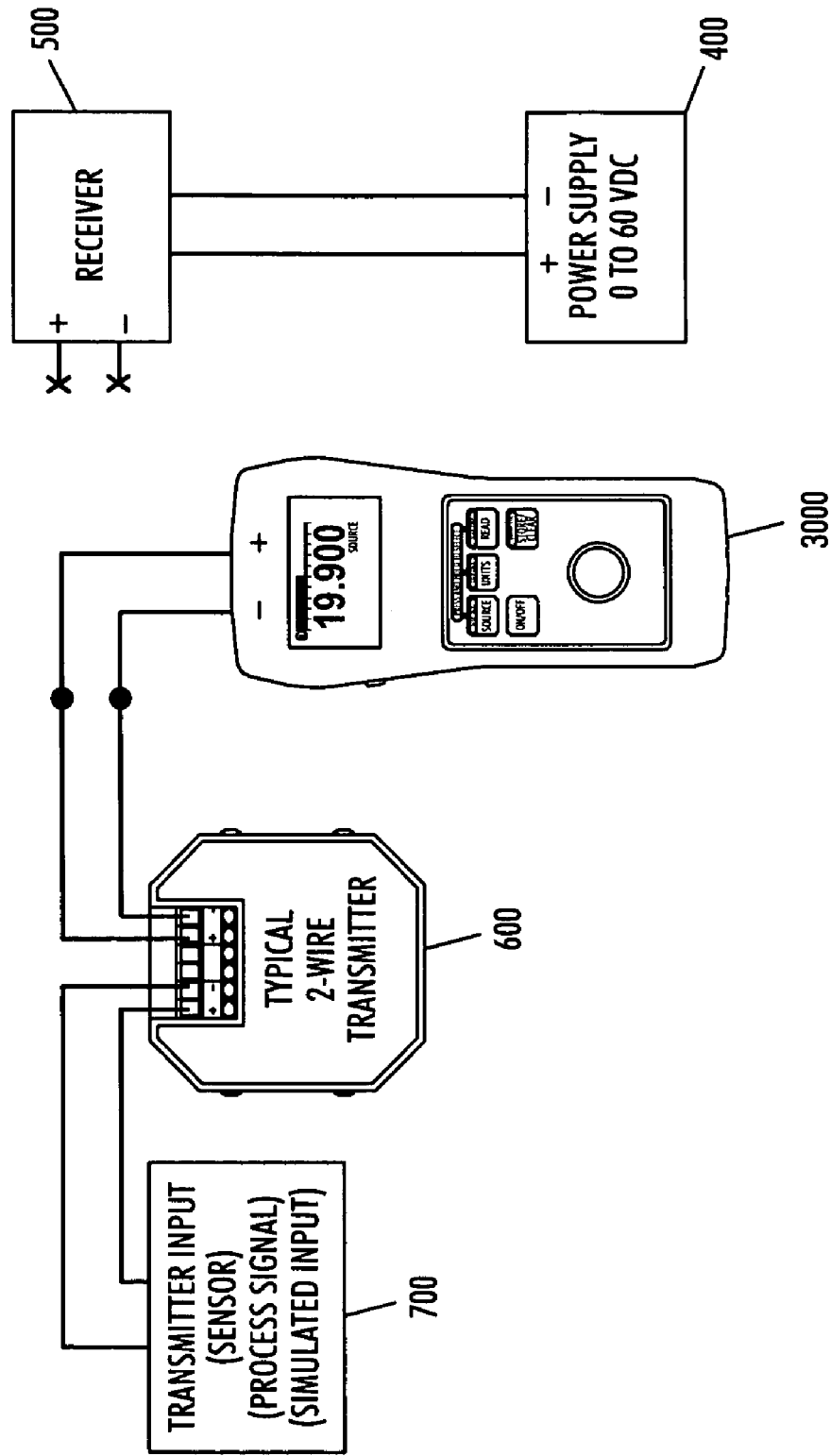
FIG. 14 illustrates wiring configuration for calibrating using the portable process calibrator in the power and measure two-wire transmitter mode according to the concepts of the present invention.

As illustrated in FIG. 14, a process loop includes a power source 400, a receiver 500, a two-wire transmitter 600, and a transmitter input 700, such as a sensor, process signal, or simulated input. To read the loop current, voltage, and resistance of the process loop, a break in the connection between an output of the receiver 500 and an input to the two-wire transmitter 600 is created, and a break in the connection between an input of the receiver 500 and an output to the two-wire transmitter 600 is created. The portable process calibrator 3000 is connected across two-wire transmitter 600 so as to complete the circuit path allowing the portable process calibrator 3000 to measure the loop current, voltage, and resistance of the process loop. It is noted that current limiting above 24 mA is indicated on the display 3082 by a flashing "CURRENT LIMITED."

Figure 7:
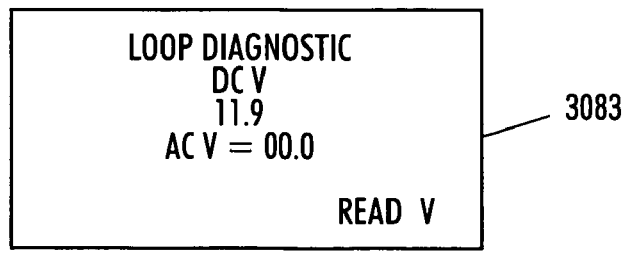

As illustrated in FIG. 7, display 3083 will display the measured characteristics of the voltage when the read mode is read volts. This mode of operation is illustrated in FIG. 15.

Figure 15:
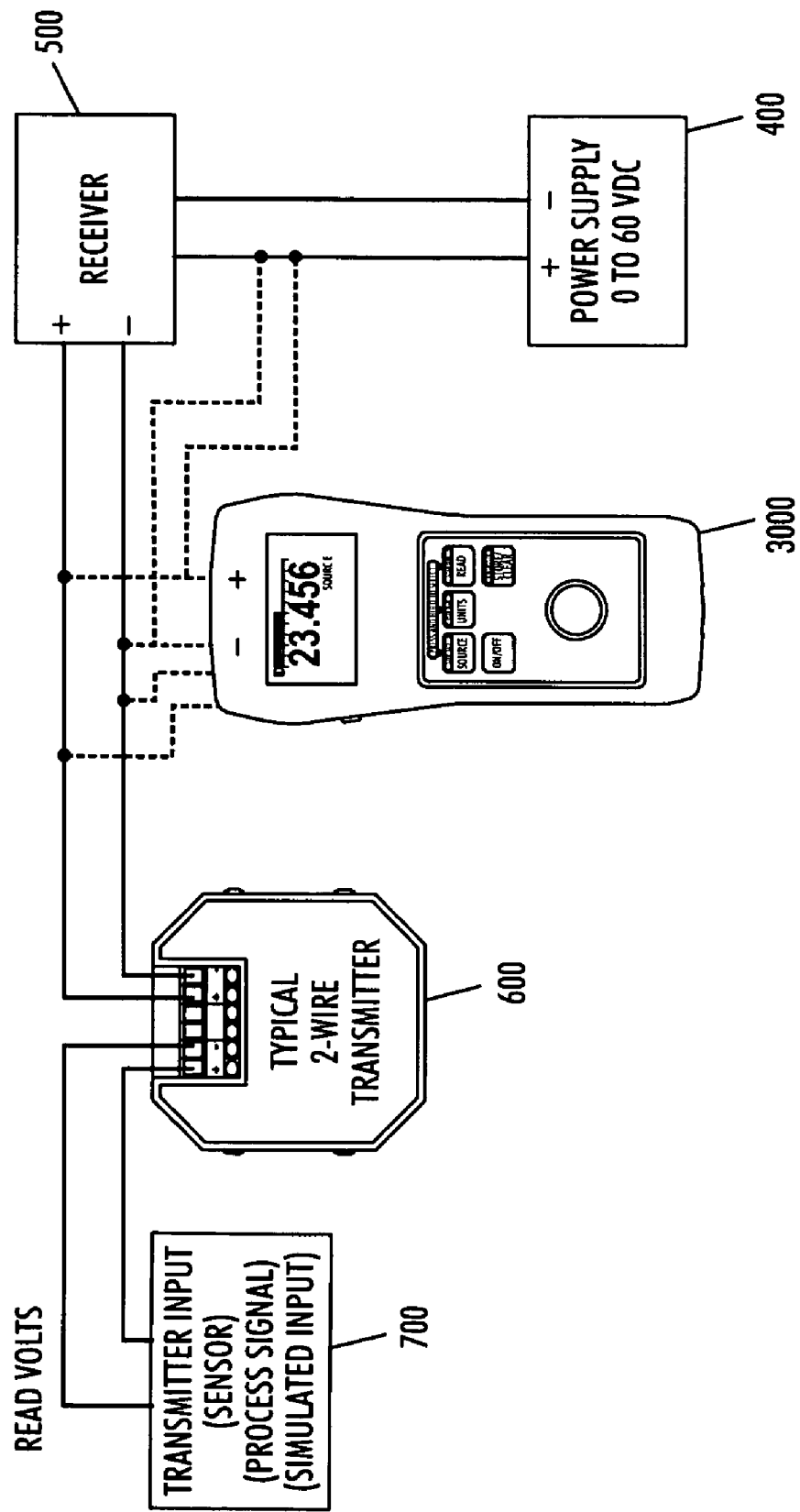
FIG. 15 illustrates wiring configuration for calibrating using the portable process calibrator in the read volts mode according to the concepts of the present invention.

As illustrated in FIG. 15, a process loop includes a power source 400, a receiver 500, a two-wire transmitter 600, and a transmitter input 700, such as a sensor, process signal, or simulated input. To read the loop voltage of the process loop, the portable process calibrator 3000 is connected across either power source 400 or the receiver 500 so as to measure the voltage of the process loop. It is noted that the display 3083 flashes "OVERRANGE" when the 30-volt limit is exceeded.

Figure 8:
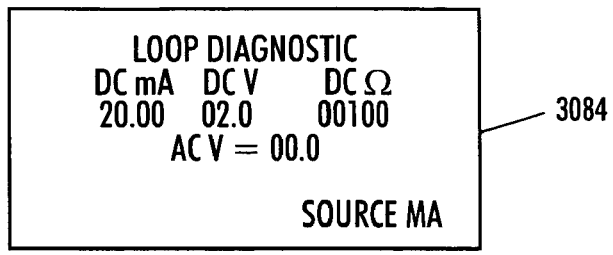
FIGS. 8–10 illustrate the various displays for the various source modes according to the concepts of the present invention.

As illustrated in FIG. 8, display 3084 will display the measured characteristics of the loop current, voltage, and resistance when the source mode is source milliamps. It is noted that the resistance is highlighted when it exceeds the output capability of the portable process calibrator 3000. This mode of operation is illustrated in FIG. 16.

Figure 16:
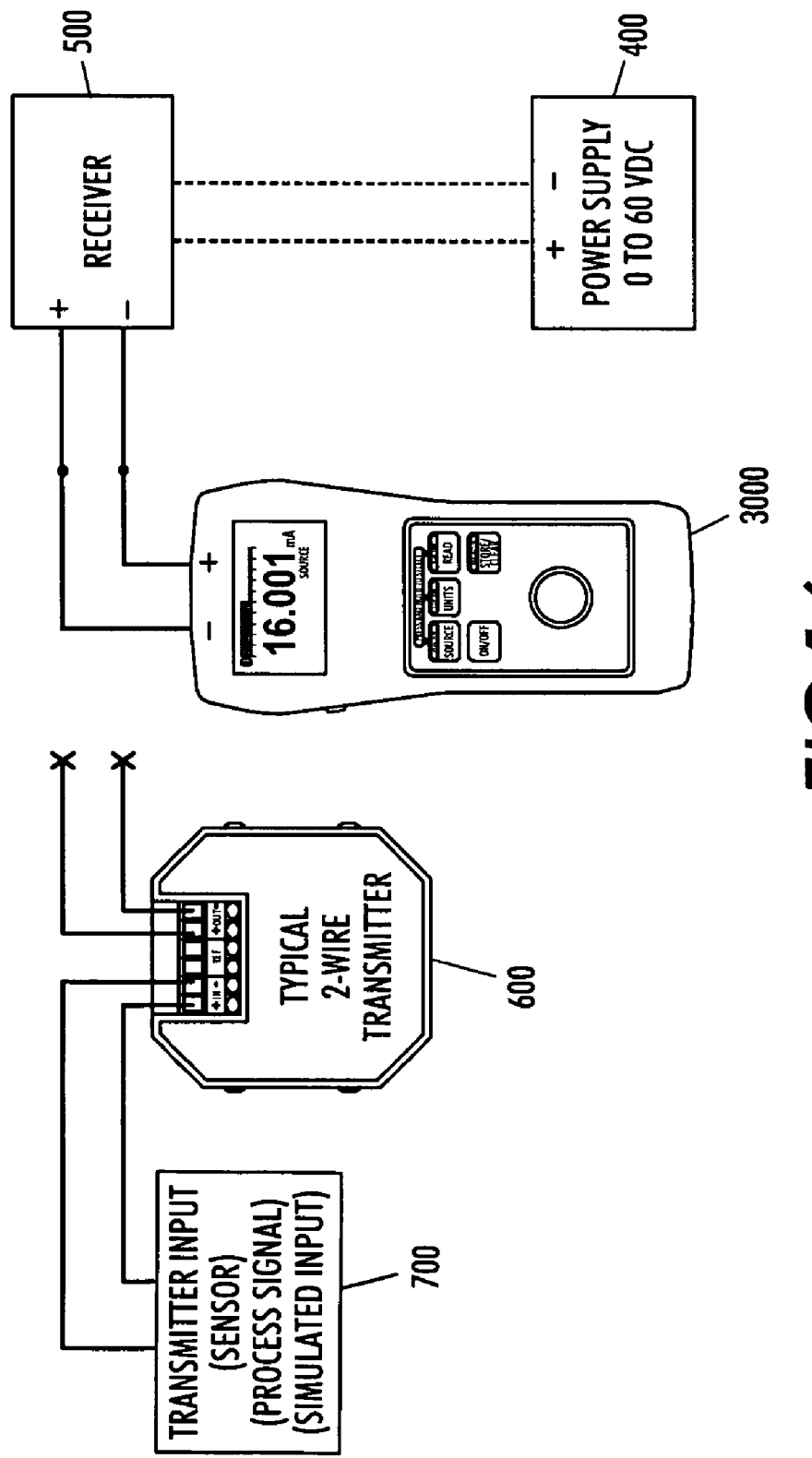
FIG. 16 illustrates wiring configuration for calibrating using the portable process calibrator in the source milliamp mode according to the concepts of the present invention.

As illustrated in FIG. 16, a process loop includes a power source 400, a receiver 500, a two-wire transmitter 600, and a transmitter input 700, such as a sensor, process signal, or simulated input. To read the loop current, voltage, and resistance of the source of the process loop, a break in the connection between an output of the receiver 500 and an input to the two-wire transmitter 600 is created, and a break in the connection between an input of the receiver 500 and an output to the two-wire transmitter 600 is created. The portable process calibrator 3000 is connected across receiver 500 allowing the portable process calibrator 3000 to measure the loop current, voltage, and resistance of the source of the process loop. It is noted that the display 3084 flashes "HIGH Ω" when the loop resistance is too high or the leads are open.

Figure 9:
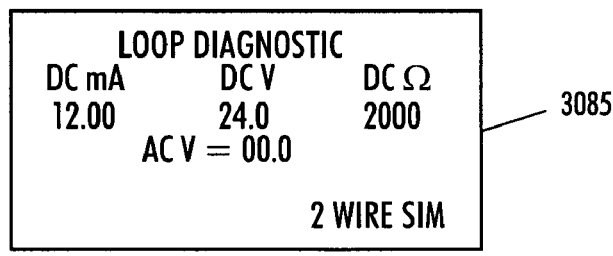

As illustrated in FIG. 9, display 3085 will display the measured characteristics of the loop current when the source mode is two-wire transmitter simulate. This mode of operation is illustrated in FIG. 17.

Figure 17:
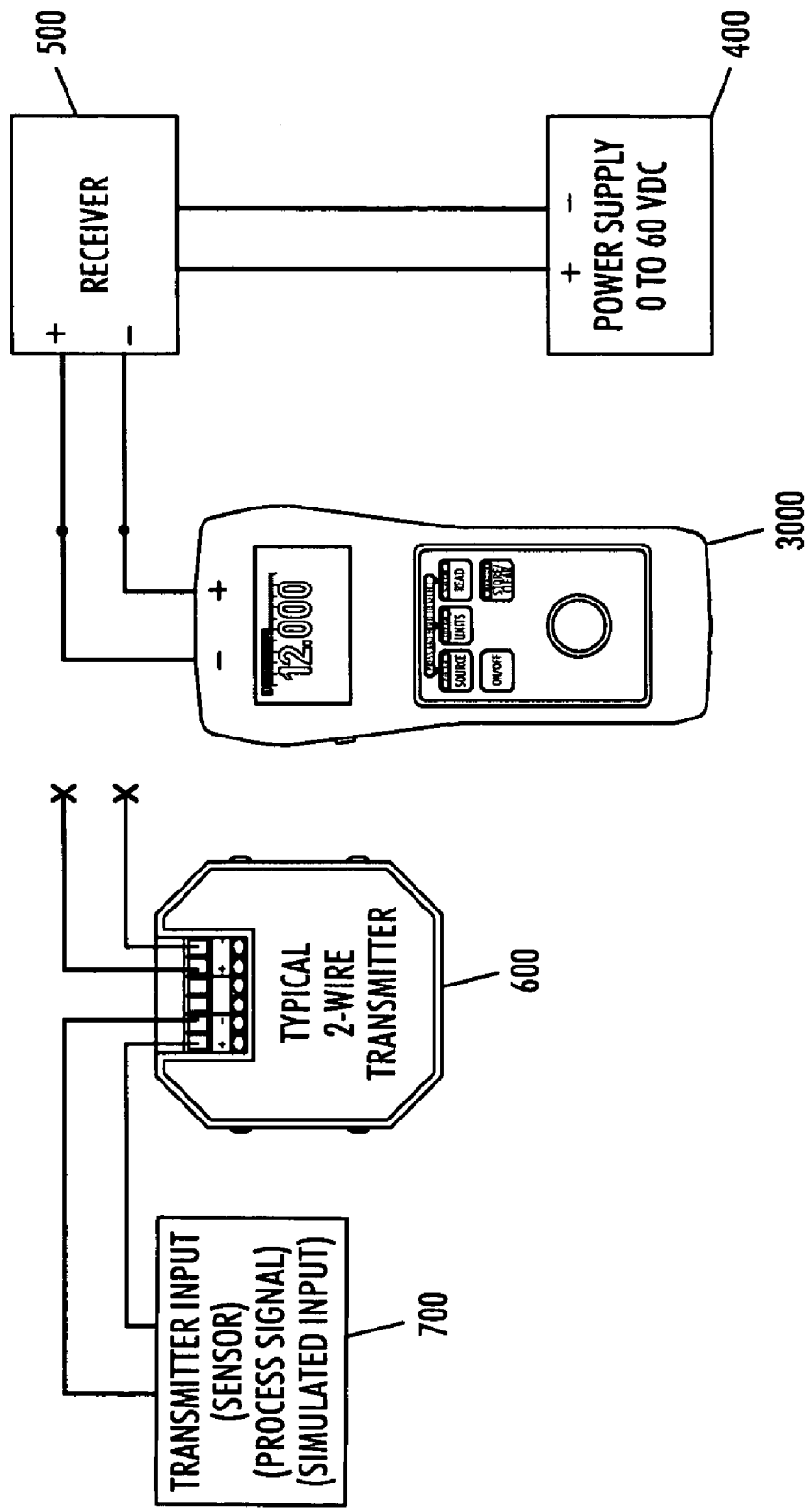
FIG. 17 illustrates wiring configuration for calibrating using the portable process calibrator in the two-wire transmitter simulate mode according to the concepts of the present invention.

As illustrated in FIG. 17, a process loop includes a power source 400, a receiver 500, a two-wire transmitter 600, and a transmitter input 700, such as a sensor, process signal, or simulated input. To read the loop current of the source of the process loop, a break in the connection between an output of the receiver 500 and an input to the two-wire transmitter 600 is created, and a break in the connection between an input of the receiver 500 and an output to the two-wire transmitter 600 is created. The portable process calibrator 3000 is connected across receiver 500 allowing the portable process calibrator 3000 to measure the loop current of the source of the process loop. In this mode, the portable process calibrator 3000 automatically performs a test every 7 seconds to compute the loop power supply voltage and loop resistance. The portable process calibrator 3000 requires approximately 2 volts across its terminals to operate in two-wire simulate mode. It is noted that the voltage display is highlighted when there is less than 2 volts present. It is further noted that the display 3085 flashes "CHECK LOOP SUPPLY" when the loop power falls below 2 volts.

Figure 10:
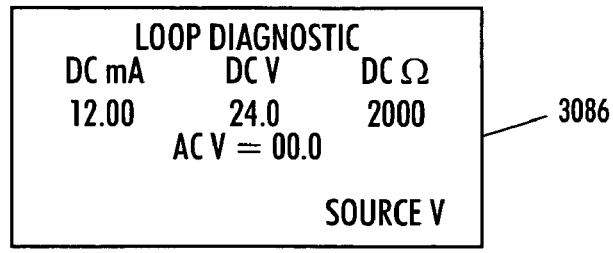

As illustrated in FIG. 10, display 3086 will display the measured characteristics of the loop current, voltage, and resistance when the source mode is source volts. It is noted that the resistance is highlighted when it exceeds the output capability of the portable process calibrator 3000. This mode of operation is illustrated in FIG. 18.

Figure 18:
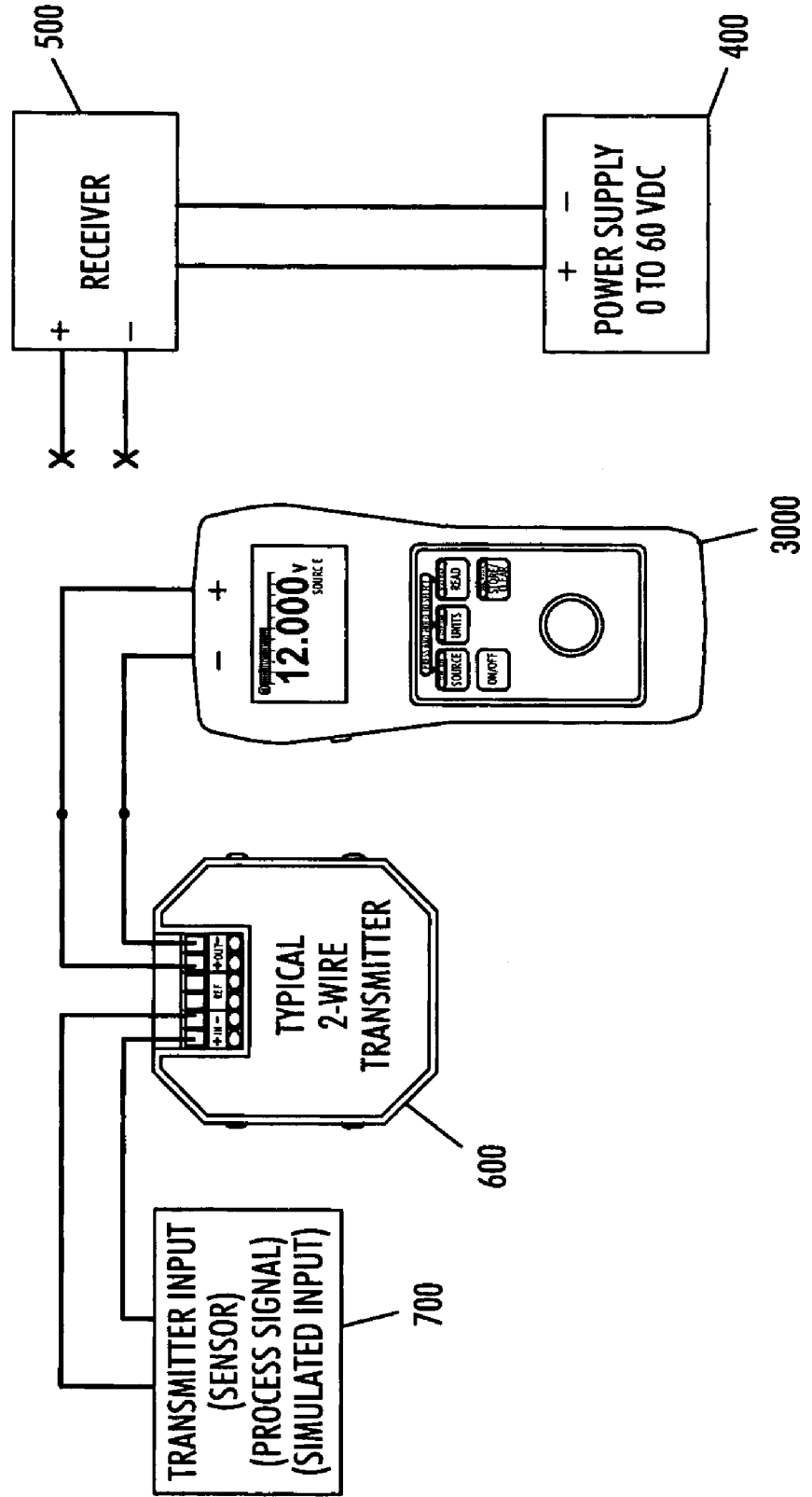
FIG. 18 illustrates wiring configuration for calibrating using the portable process calibrator in the source volts mode according to the concepts of the present invention.

As illustrated in FIG. 18, a process loop includes a power source 400, a receiver 500, a two-wire transmitter 600, and a transmitter input 700, such as a sensor, process signal, or simulated input. To read the loop current, voltage, and resistance of the source of the process loop, a break in the connection between an output of the receiver 500 and an input to the two-wire transmitter 600 is created, and a break in the connection between an input of the receiver 500 and an output to the two-wire transmitter 600 is created. The portable process calibrator 3000 is connected across two-wire transmitter 600 so as to complete the circuit path allowing the portable process calibrator 3000 to measure the loop current, voltage, and resistance of the process loop. It is noted that the display 3086 flashes "LOW Ω" when the output is overloaded.

Figure 19:
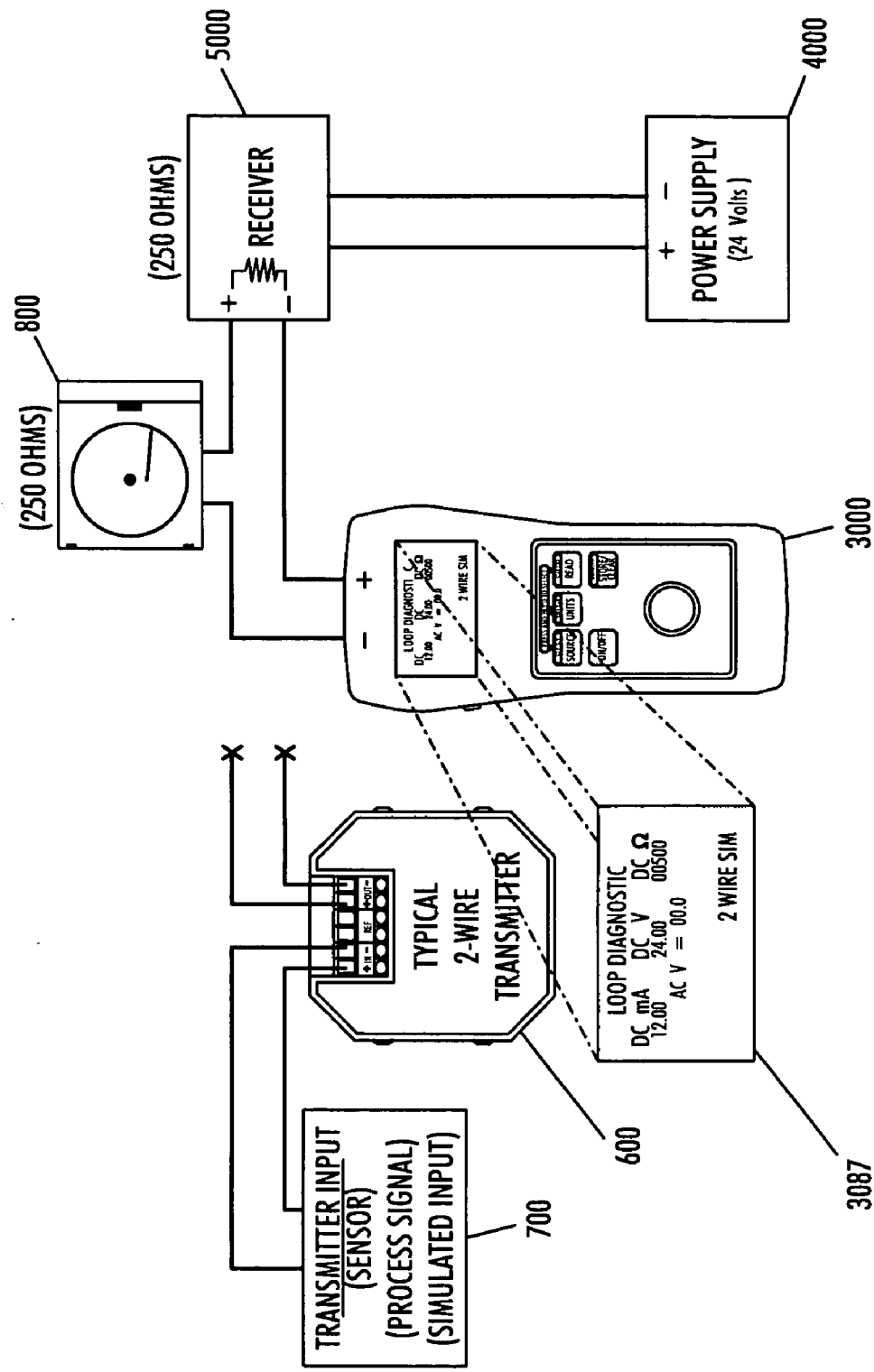
FIG. 19 illustrates wiring configuration for calibrating using the portable process calibrator in the loop diagnostic mode according to the concepts of the present invention.

FIG. 19 illustrates an example of the portable process calibrator 3000 when the source mode is two-wire transmitter simulate and a loop diagnostic is desired to detect loop current, voltage, resistance, AC voltage and HART® protocol if present in the loop. As illustrated in FIG. 19, a process loop includes a power source 4000, a receiver 5000, a two-wire transmitter 600, and a transmitter input 700, such as a sensor, process signal, or simulated input. To read the loop current, voltage, resistance, AC voltage and HART® protocol of the source of the process loop, first the portable process calibrator 3000 is placed in a HART® compatibility mode where the portable process calibrator 3000 connects a 250 Ω load resistor 800 in series with the output. Furthermore, a break in the connection between an output of the receiver 5000 and an input to the two-wire transmitter 600 is created, and a break in the connection between an input of the receiver 5000 and an output to the two-wire transmitter 600 is created. The portable process calibrator 3000 is connected across receiver 5000 so as to complete the circuit path allowing the portable process calibrator 3000 to measure the loop current, voltage, resistance, AC voltage and HART® protocol of the process loop and to display the characteristics thereof on display 3087.

Figure 12:
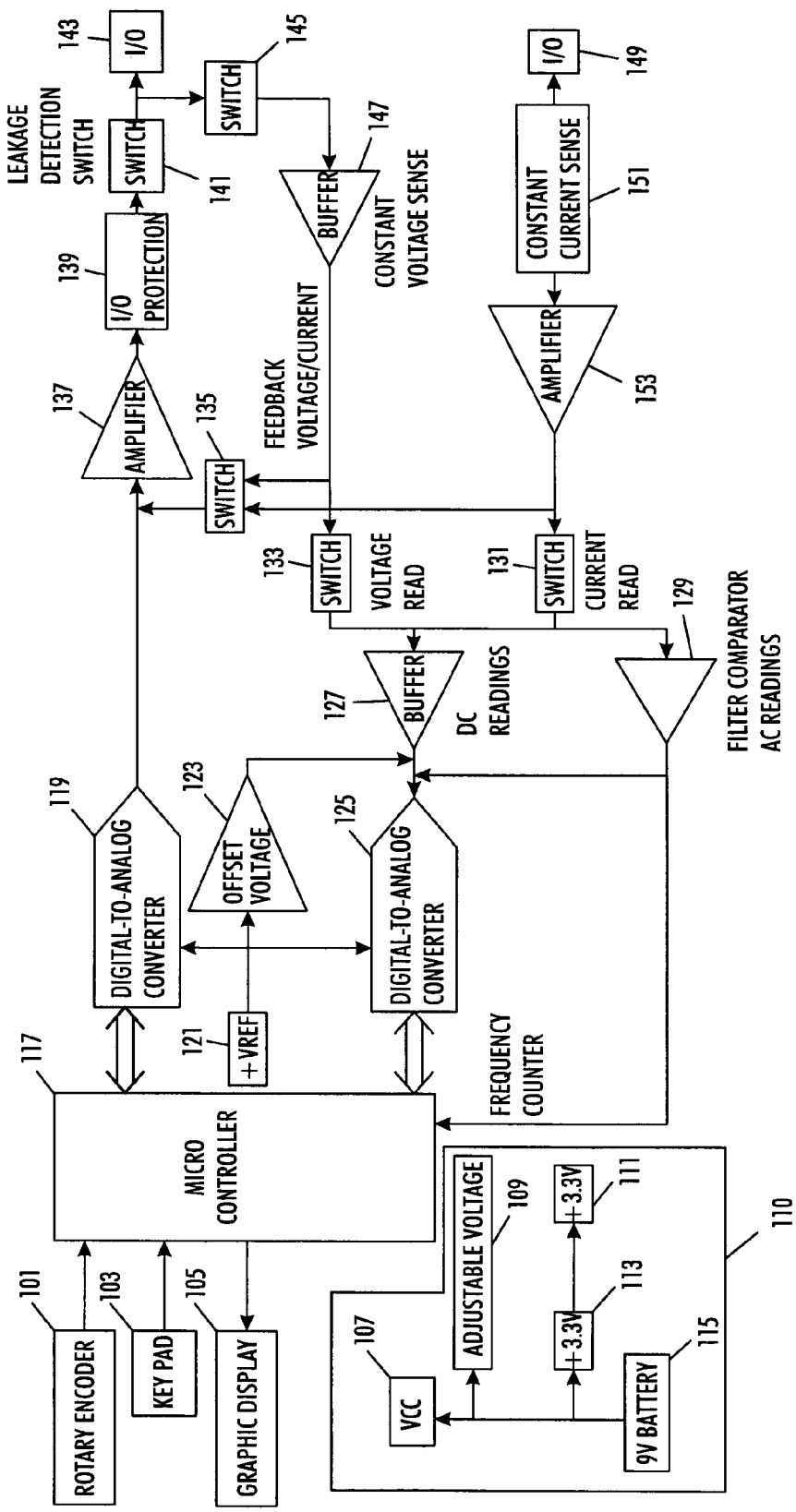
FIG. 12 illustrates a block diagram of the circuitry for the portable process calibrator according to the concepts of the present invention.

FIG. 12 illustrates a block diagram of circuitry for the portable process calibrator 3000. The portable process calibrator 3000 includes a power supply 110 having a battery 115, a 3.3 voltage source 113, a ±3.3 voltage source 111, an adjustable voltage source 109, and a $V_{CC}$ voltage source 107. A rotary encoder 101 and a keypad 103 are included in the portable process calibrator 3000 to enable the user to input information. A display 105 is provided to convey information to the user.

A micro-controller 117 controls the basic functions of the portable process calibrator 3000. Connected to the micro-controller 117 is a digital to analog converter 119 to convert digital signals from the micro-controller 117 into analog signals for outputting to the loop process and an analog to digital converter 125 to convert analog signals from loop process into digital signals for inputting to the micro-controller 117. A reference voltage source 121 is connected to the digital to analog converter 119, the analog to digital converter 125, and an offset voltage circuit 123.

The output from the digital to analog converter 119 is fed to an amplifier 137 for amplification. The amplified signal passes through an I/O protection circuit 139 and switch 141 before being output onto the loop process via I/O port or connection 143. The signal from the loop can be feedback through switch 145, a programmable front-end resistor divider 147, switch 133, and buffer 127 to analog to digital converter 125 for measuring by micro-controller 117 wherein this path provides a voltage read to micro-controller 117. It is noted that the signal can also be fed back to the loop through switch 135.

I/O protection circuit 139 contains two switches and a calibrated resistance. The two switches of I/O protection circuit 139 form two paths, one path being of low impedance, and the second path being switched in or out to provide additional impedance from the calibrated resistance therein. Switch 145 also contains two switches and a calibrated resistance. The two switches of switch 145 form two paths, one path being of low impedance, and the second path being switched in or out to provide additional impedance from the calibrated resistance therein.

A signal from the loop can be fed from I/O port or connection 149 through constant current sense 151, amplifier 153, switch 131, and buffer 127 to analog to digital converter 125 for measuring by micro-controller 117 wherein this path provides a current read to micro-controller 117. Switches 133 and 131 are also connected to filter comparator 129 to provide AC readings to micro-controller 117.

As illustrated in FIG. 12, the portable process calibrator 3000 of the present invention incorporates circuitry to measure DC voltage, AC voltage, DC current, AC current, Common mode voltage, Resistance, and Complex impedances, Frequency and digital communications that are occurring. The portable process calibrator 3000 can also derive leakage currents when attached to a constant current source.

In operations, the portable process calibrator 3000 measures DC voltage by using a programmable front-end resistor divider 147, which monitors the input voltage on a constant basis, and AC voltage by using a bridge rectifier. DC current is measured by monitoring an "in" circuit current shunt resistor. AC current is also measured by using the shunt resistor. Frequency is measured by monitoring a comparator attached to the front-end resistor divider. Moreover, complex impedances are measured by monitoring the comparator along with a constant current or voltage source for a specified period of time, C=dV/dt and L=dI/dt. Resistance is monitored by making appropriate input and current readings, R=V/I. Also, common mode voltages and currents are monitored using a wide common mode range instrumentation amplifier fed either to the AC or DC measuring circuits.

Digital communications are monitored using voltage information from the voltage read path and frequency information from the filter comparator 129 and comparing this information to known communication waveforms.

Leakage current is calculated by measuring the unloaded DC or AC current. Then the portable process calibrator 3000 changes the load. The load is changed through switches 139 and 145, which, as noted above, contain two switches and a calibrated resistance to form two paths, one path being of low impedance, and the second path being switched in or out to provide additional impedance from the calibrated resistance therein. Utilizing these switches, the resistance in the loop can be changed. Since the process loop, the two-wire transmitter, is assumed to be a constant current source, the current should not change with a change in resistance. If the current changes with change of resistance, this is an error. Thus, if the current does change, the portable process calibrator 3000 displays the change in current as leakage since this is clearly not controlled by the constant current source. In other words, if the current changes with changing load, it is determined that a constant current source is not present; and therefore, the loop process is determined to be resistive or has leakage bypassing the constant current source. This is measured by the change in current with respect to load.

In FIG. 12, output amplifier 137 with voltage feedback and/or current feedback sources the DC voltage and DC current. Both these functions can be enabled at any time to produce the required output as well as derive other unknown variables. Frequency can be produced from the micro-controller 117 running real time direct to digital synthesis techniques that involve real time calculations to produce voltages with respect to time; i.e., frequency.

Figure 20:
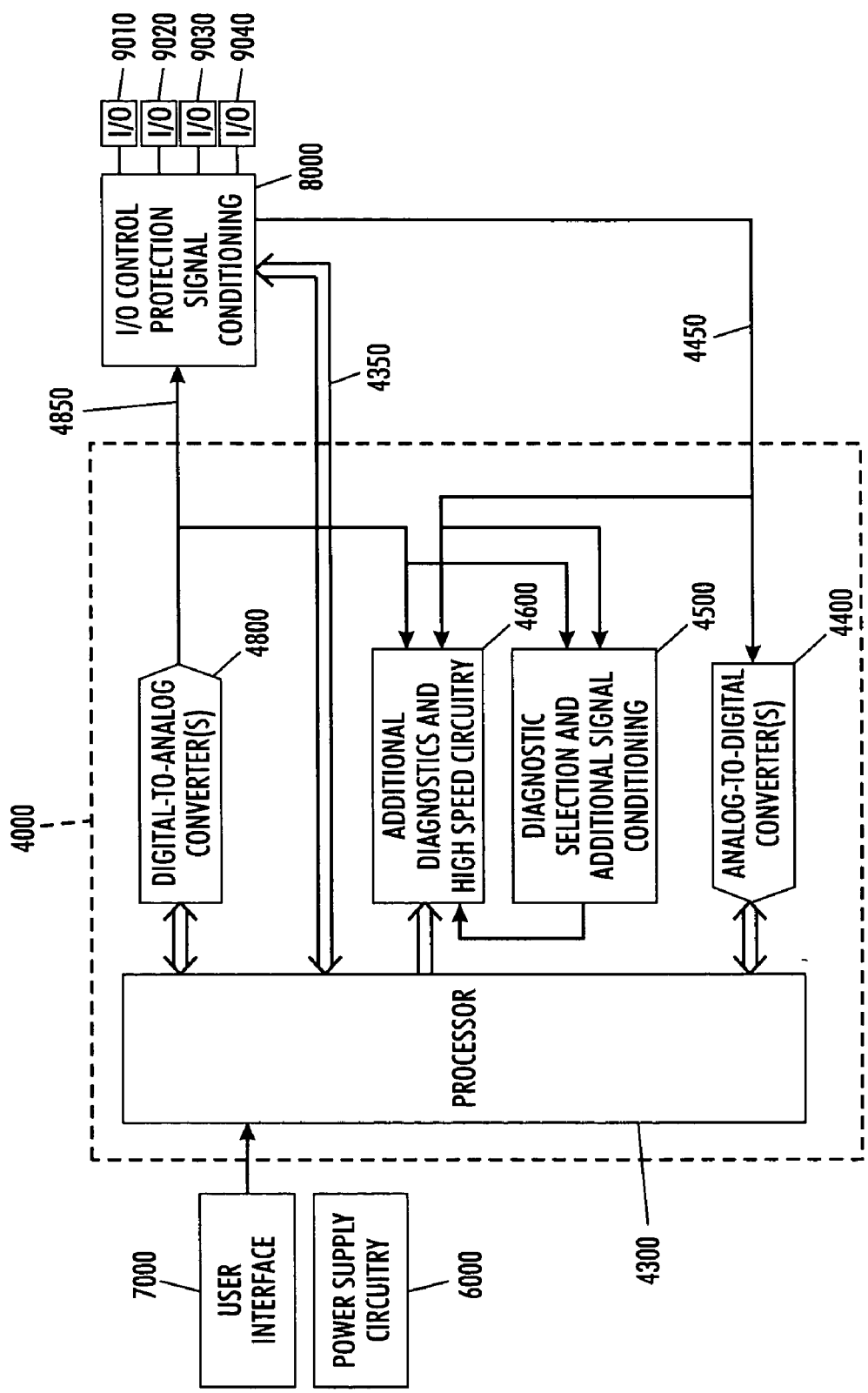
FIG. 20 illustrates a block diagram of the circuitry for the portable process calibrator according to the concepts of the present invention.

FIG. 20 illustrates a block diagram of circuitry for the portable process calibrator. The portable process calibrator includes a power supply 6000 having a battery, predetermined calibrated voltage sources, an adjustable voltage source, and a $V_{CC}$ voltage source. The portable process calibrator also includes a user interface 7000. The user interface 7000 may have a rotary encoder, a keypad, a touch screen, voice activation input, or combination thereof to enable the user to input information. A display is also provided to convey information to the user.

A processing unit 4000 which includes a processor 4300 controls the basic functions of the portable process calibrator. Within the processing unit 4000, is a digital to analog converter 4800 to convert digital signals from the processor 4300 into analog signals for outputting to the loop process, via bus 4850, and an analog to digital converter 4400 to convert analog signals from loop process into digital signals for inputting to the processor 4300, via bus 4450. The processing unit 4000 also includes additional diagnostic circuitry 4600 and signal conditioning circuitry 4500.

The output from the digital to analog converter 4800 is fed to an I/O (Input/Output) control, protection, signal conditioning circuit 8000, via bus 4850. As discussed above, the I/O control, protection, signal conditioning circuit 8000 may include an amplifier for amplification. The amplified signal passes through an I/O protection circuit and switch before being output onto the loop process via one of the I/O ports (9010, 9020, 9030, or 9040). The signal from the loop can be feedback through the I/O control, protection, signal conditioning circuit 8000 to analog to digital converter 4400, via bus 4450 for measuring by processor 4300 wherein this path provides a voltage read to processor 4300. It is noted that the signal can also be fed back to the loop depending upon the connection configuration of the I/O control, protection, signal conditioning circuit 8000. The connection configuration of the I/O control, protection, signal conditioning circuit 8000 is controlled by control signals from the processor 4300, via bus 4350. Depending upon the mode of operation of the portable process calibrator, the processor 4300, via bus 4350, will send control signals to the I/O control, protection, signal conditioning circuit 8000 which causes the I/O control, protection, signal conditioning circuit 8000 to configure the connection scheme between the processing unit 4000 and the input/output ports (9010, 9020, 9030, or 9040) so that the proper test signals are sent to the monitored device and the return signals are routed along the proper path to the processing unit 4000. It is noted that monitored device may be the actual connection leads coming from the portable process calibrator to determine if the leads are properly working without leakage or open circuits.

The I/O control, protection, signal conditioning circuit 8000 may contain two switches and a calibrated resistance. The two switches of the I/O control, protection, signal conditioning circuit 8000 form two paths, one path being of low impedance, and the second path being switched in or out to provide additional impedance from the calibrated resistance therein.

The I/O control, protection, signal conditioning circuit 8000 may also contain two switches and voltage source. The two switches of the I/O control, protection, signal conditioning circuit 8000 form two paths, one path being of low impedance, and the second path enabling the switching in or out of the voltage source to provide additional impedance from the calibrated resistance therein.

The I/O control, protection, signal conditioning circuit 8000 may also contain two switches and a current source. The two switches of the I/O control, protection, signal conditioning circuit 8000 form two paths, one path being of low impedance, and the second path enabling the switching in or out of the current source to provide additional impedance from the calibrated resistance therein.

The present invention can also perform a diagnostic 2, 3, 4 wire connection test. In this embodiment, the present invention sends out an electronic test pulse or series of voltage/current pulses to determine which leads are connected. From this information, the present invention is able to display the connection errors. This alerts the user to what operating mode the sensor is connected or of wiring errors if inconsistently with the installation.

Figure 21:
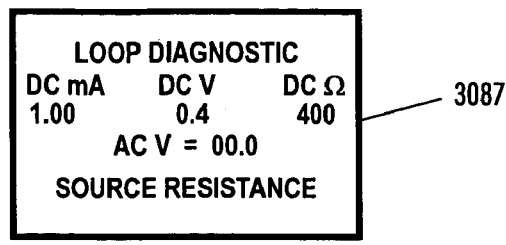
FIGS. 21–28 illustrate the various displays for the various modes according to the concepts of the present invention.
Figure 22:
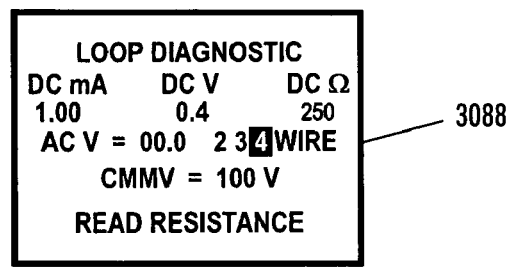
Figure 23:
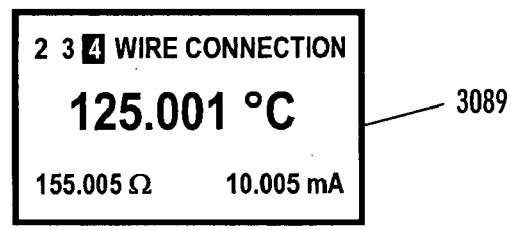

With respect to FIG. 21, FIG. 21 illustrates a display screen 3087 for a source resistance/RTD (Resistance temperature detector) mode for the portable process calibrator. The unit under test is sourcing resistance or Resistance temperature detector temperature. The diagnostic screen 3087 is showing the portable process calibrator sourcing resistance and/or Resistance temperature detector and measuring DC current, DC voltage, and AC voltage. With respect to FIG. 22, FIG. 22 illustrates a display screen 3088 for a read resistance mode. The unit under test is reading resistance. The diagnostics screen 3088 will show the portable process calibrator measuring DC resistance, DC current, DC Voltage, AC Voltage command mode voltage. The screen will show if 2 or 3 or 4 wires are connected. With respect to FIG. 23, FIG. 23 illustrates a display screen 3089 for a read resistance temperature device mode. The portable process calibrator is showing and Resistance temperature detector temperature in degrees F. or C. and DC current and DC resistance. The screen 3089 will show if 2 or 3 or 4 wires are connected.

Figure 24:
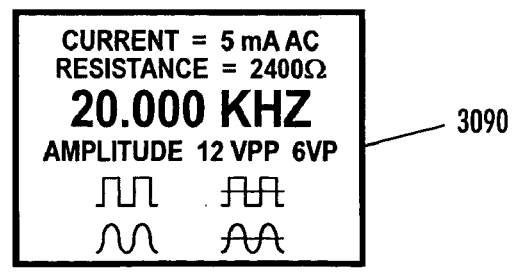
Figure 25:
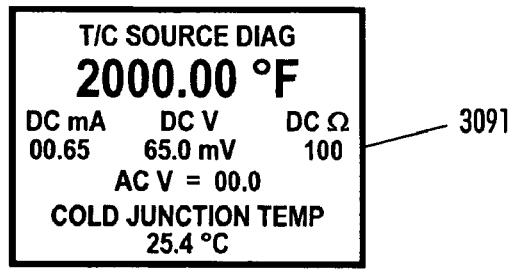
Figure 26:
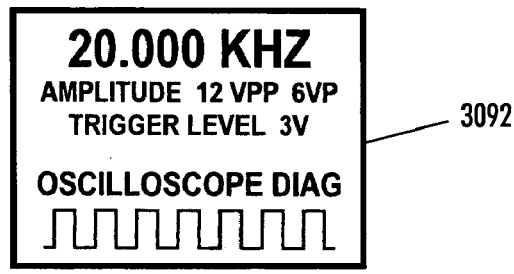

With respect to FIG. 24, FIG. 24 illustrates a display screen 3090 for a source frequency mode. The unit under test is sourcing frequency and measuring AC current, resistance, and amplitude of the frequency signal in volt peak to peak and volts peak. Voltage peak to peak will be different than volts peak if the sine or square wave is zero crossing. With respect to FIG. 25, FIG. 25 illustrates a display screen 3091 for a thermocouple source mode. The unit under test is sourcing the thermocouple temperature and measuring DC current, DC voltage, DC resistance, AC voltage, and cold junction temperature. With respect to FIG. 26, FIG. 26 illustrates a display screen 3092 for a read frequency mode. The portable process calibrator is reading frequency and measuring the amplitude voltage in voltage peak to peak and voltage peak. The trigger level which the user used is displayed. A graphical representation of the frequency signal is displayed.

Figure 27:
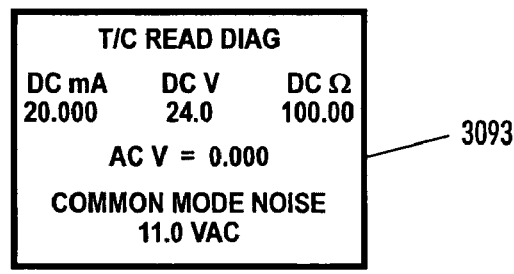
Figure 28:
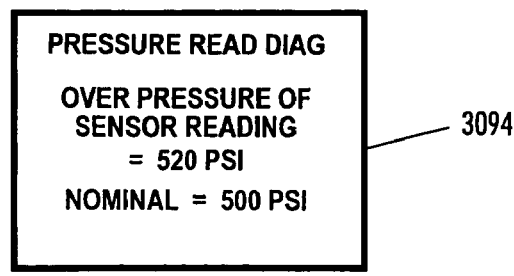

With respect to FIG. 27, FIG. 27 illustrates a display screen 3093 for a thermocouple read mode. The portable process calibrator is showing the thermocouple reading, DC current, DC voltage, DC resistance, AC voltage, and command mode voltage. With respect to FIG. 28, FIG. 28 illustrates a display screen 3093 for a read pressure mode. The portable process calibrator is reading pressure and if the pressure sensor has been over pressured.

The present invention, when in read voltage mode, introduces an impedance change. This can be realized through current voltage difference or resistive load changes. The characteristics changes introduce a "load" change to the device under test. This "load" change allows the unknown source resistance of the device under test to be determined; i.e., if a 1 mA "load" current is introduced and a voltage drop of 1 volt is measured, the output impedance is (DC example) 1000 ohms. Therefore, the DC output impedance is 1000 ohms. AC output impedance can be measured in a similar fashion with the added timing of the changes being measured to determine complex impedances including inductance and capacitance.

The present invention can also perform linearity testing. This testing is realized by showing the differential actual output value versus the theoretical values. As determined by the endpoints and any underlying input/output relationships. For example, for thermocouples showing 100 degrees C. as a low endpoint and 500 degrees C. as a high endpoint, by comparing the actual "voltage" outputs produced versus the theoretical values, a characteristic "non-linearity" graph can be produced.

Lastly, The present invention can perform capacitance testing and inductive testing. The present invention can measure these values by measuring the timing changes similar to the output impedance test. More specifically, by introducing a change in voltage and determining the time needed for this change to occur, the presenting invention can determine the capacitance. Moreover, by introducing a change in current and determining the time needed for this change to occur, the presenting invention can determine the inductance.

As noted above, the present invention is directed to a testing device for determining values of various electrical variables associated with a device within a process system. The testing device provides bi-directional electrical communication with a device to be monitored and automatically provides a connection configuration between a processing unit and a set of input/output ports. The connection configuration governs a bi-directional flow of electrical signals between the processing unit and the device to be monitored. The processing unit outputs a test signal and a configuration control signal to the input/output port control circuitry. The input/output port control circuitry, in response to received test and configuration control signals, automatically provides a connection configuration to direct the test signal to the device to be monitored and to direct a return signal, the return signal being generated by the monitored device in response to the test signal, to the processing unit. The processing unit, based upon the connection configuration of the input/output port control circuitry, measures an electrical characteristic of the return signal and determines at least two electrical variables associated with the monitored device based upon the measured electrical characteristic of the return signal generated by the monitored device.

The processing unit, based upon the connection configuration of the input/output port control circuitry, substantially concurrently measures the electrical characteristic of the return signal and determines at least two electrical variables associated with the monitored device based upon the measured electrical characteristic of the return signal generated by the monitored device.

For example, the processing unit substantially concurrently measures the electrical characteristic of the return signal and determines an electrical current value and a voltage value for the monitored device based upon the measured electrical characteristic of the return signal generated by the monitored device; substantially concurrently measures the electrical characteristic of the return signal and determines an electrical current value, an impedance value, and a voltage value for the monitored device based upon the measured electrical characteristic of the return signal generated by the monitored device; substantially concurrently measures the electrical characteristic of the return signal and determines a voltage amplitude value, an impedance value, and a voltage frequency value for the monitored device based upon the measured electrical characteristic of the return signal generated by the monitored device; substantially concurrently measures the electrical characteristic of the return signal and determines an AC voltage value and a DC voltage value for the monitored device based upon the measured electrical characteristic of the return signal generated by the monitored device; substantially concurrently measures the electrical characteristic of the return signal and determines a voltage value and an impedance value for the monitored device based upon the measured electrical characteristic of the return signal generated by the monitored device; substantially concurrently measures the electrical characteristic of the return signal and determines an electrical current value and an impedance value for the monitored device based upon the measured electrical characteristic of the return signal generated by the monitored device; substantially concurrently measures the electrical characteristic of the return signal and determines a voltage value and a frequency value for the monitored device based upon the measured electrical characteristic of the return signal generated by the monitored device; and/or substantially concurrently measures the electrical characteristic of the return signal and determines an electrical current value and a frequency value for the monitored device based upon the measured electrical characteristic of the return signal generated by the monitored device.

In one embodiment, the present invention includes an impedance circuit to control electrical characteristics of the ports of the set of input/output ports. The processing unit outputs impedance control signals to the input/output port control circuitry. The input/output port control circuitry, in response to received impedance control signals, causes an impedance associated with the ports to change. The processing unit, based upon the connection configuration of the input/output port control circuitry with changed impedance, measures the electrical characteristic of the return signal and determines a diagnostic electrical variable associated with the monitored device based upon the return signal generated by the monitored device when the impedance associated with the ports is changed. The processing unit compares the diagnostic electrical variable with an electrical variable associated with the monitored device based upon the return signal generated by the monitored device when the impedance associated with the ports is not changed to determine if there is a problem with the monitored device.

In another embodiment, the present invention includes an impedance circuit to control electrical characteristics of the ports of the set of input/output ports. The processing unit, based upon the connection configuration of the input/output port control circuitry, measures the electrical characteristic of the return signal and determines an electrical current value associated with the monitored device based upon the return signal generated by the monitored device when an impedance associated with the ports is a first impedance. The processing unit outputs impedance control signals to the input/output port control circuitry. The input/output port control circuitry, in response to received impedance control signals, causes an impedance associated with the ports to change to a second impedance. The processing unit, based upon the connection configuration of the input/output port control circuitry with changed impedance, measures the electrical characteristic of the return signal and determines a diagnostic electrical current value associated with the monitored device based upon the return signal generated by the monitored device when the impedance associated with the ports is the second impedance. The processing unit compares the diagnostic electrical current value with the electrical current value to determine if there is a leakage is associated with the monitored device.

The present invention may include an impedance circuit to control electrical characteristics of the ports of the set of input/output ports; switches and a calibrated impedance element, the switches switching the calibrated impedance element in and out of a circuit path associated with a port to change an impedance characteristic of the port; switches and a voltage source, the switches switching the voltage source in and out of a circuit path associated with a port to change an impedance characteristic of the port; and/or switches and a current source, the switches switching the current source in and out of a circuit path associated with a port to change an impedance characteristic of the port.

In summary, the present invention derives and displays non-primary variables using software, electronics, hardware, and/or calculations with minimal connections and reconfiguration. The present invention can also identify either the primary or non-primary variables that are abnormal for the application or out of tolerance. The present invention can display concurrently the primary variable along with dynamic and static variables with changing circuit conditions. In most cases, the user interface controls are still usable and available to adjust the input or output and monitor changes in the operation of the system or device being tested.

The present invention supplies information about the normally unseen working conditions that may affect the reliability and aids in the rapid test and documentation of operating conditions during test or recalibrations.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A testing device for determining values of various electrical properties associated with a device within a process system, comprising:

a set of ports to provide an electrical interface;

a processing unit; and a port control circuitry, operatively connected to said set of ports and said processing unit, to automatically provide a connection configuration between said processing unit and said set of ports, said connection configuration governing a flow of electrical signals between said processing unit and the device to be monitored;

said processing unit outputting an analog test signal and a configuration control signal to said port control circuitry;

said port control circuitry, in response to the analog test signal and configuration control signal, automatically providing a connection configuration to direct the analog test signal to the device to be monitored and to direct an analog return signal associated with a first port of said set of ports, said analog return signal associated with the first port of said set of ports being generated by the monitored device in response to the analog test signal, to said processing unit;

said processing unit, based upon the connection configuration of said port control circuitry, measuring an electrical property of said analog return signal associated with the first port of said set of ports and determining two properties associated with the monitored device based upon the measured electrical property of said analog return signal associated with the first port of said set of ports generated by the monitored device.

2. The testing device as claimed in claim 1, wherein said processing unit, based upon the connection configuration of said port control circuitry, substantially concurrently measures the electrical property of said analog return signal and determines two properties associated with the monitored device based upon the measured electrical property of said analog return signal associated with the first port of said set of ports generated by the monitored device.

3. The testing device as claimed in claim 2, wherein said processing unit substantially concurrently measures the electrical property of said analog return signal and determines an electrical current value and a voltage value for the monitored device based upon the measured electrical property of said analog return signal associated with the first port of said set of ports generated by the monitored device.

4. The testing device as claimed in claim 2, wherein said processing unit substantially concurrently measures the electrical property of said analog return signal and determines an electrical current value, an impedance value, and a voltage value for the monitored device based upon the measured electrical property of said analog return signal associated with the first port of said set of ports generated by the monitored device.

5. The testing device as claimed in claim 2, wherein said processing unit substantially concurrently measures the electrical property of said analog return signal and determines a voltage amplitude value, an impedance value, and a voltage frequency value for the monitored device based upon the measured electrical property of said analog return signal associated with the first port of said set of ports generated by the monitored device.

6. The testing device as claimed in claim 2, wherein said processing unit substantially concurrently measures the electrical property of said analog return signal and determines an AC voltage value and a DC voltage value for the monitored device based upon the measured electrical property of said analog return signal associated with the first port of said set of ports generated by the monitored device.

7. The testing device as claimed in claim 2, wherein said processing unit substantially concurrently measures the electrical property of said analog return signal and determines a voltage value and an impedance value for the monitored device based upon the measured electrical property of said analog return signal associated with the first port of said set of ports generated by the monitored device.

8. The testing device as claimed in claim 2, wherein said processing unit substantially concurrently measures the electrical property of said analog return signal and determines an electrical current value and an impedance value for the monitored device based upon the measured electrical property of said analog return signal associated with the first port of said set of ports generated by the monitored device.

9. The testing device as claimed in claim 2, wherein said processing unit substantially concurrently measures the electrical property of said analog return signal and determines a voltage value and a frequency value for the monitored device based upon the measured electrical property of said analog return signal associated with the first port of said set of ports generated by the monitored device.

10. The testing device as claimed in claim 2, wherein said processing unit substantially concurrently measures the electrical property of said analog return signal and determines an electrical current value and a frequency value for the monitored device based upon the measured electrical property of said analog return signal associated with the first port of said set of ports generated by the monitored device.

11. The testing device as claimed in claim 1, wherein said port control circuitry includes an impedance circuit to control electrical characteristics of the ports of said set of ports;

said processing unit outputting impedance control signals to said port control circuitry;

said port control circuitry, in response to received impedance control signals, causing an impedance associated with the ports to change;

said processing unit, based upon the connection configuration of said port control circuitry with changed impedance, measuring the electrical property of said analog return signal associated with the first port of said set of ports and determining a diagnostic electrical variable associated with the monitored device based upon an analog return signal associated with the first port of said set of ports generated by the monitored device when the impedance associated with the ports is changed;

said processing unit comparing the diagnostic electrical variable with an electrical variable associated with the monitored device based upon an analog return signal generated by the monitored device when the impedance associated with the ports is not changed to determine if there is a problem with the monitored device.

12. The testing device as claimed in claim 1, wherein said port control circuitry includes an impedance circuit to control electrical characteristics of the ports of said set of ports;

said processing unit, based upon the connection configuration of said port control circuitry, measuring the electrical property of said analog return signal associated with the first port of said set of ports and determining an electrical current value associated with the monitored device based upon an analog return signal associated with the first port of said set of ports generated by the monitored device when an impedance associated with the ports is a first impedance;

said processing unit outputting impedance control signals to said port control circuitry;

said port control circuitry, in response to received impedance control signals, causing an impedance associated with the ports to change to a second impedance;

said processing unit, based upon the connection configuration of said port control circuitry with changed impedance, measuring the electrical property of said analog return signal associated with the first port of said set of ports and determining a diagnostic electrical current value associated with the monitored device based upon an analog return signal associated with the first port of said set of ports generated by the monitored device when the impedance associated with the ports is the second impedance;

said processing unit comparing the diagnostic electrical current value with the electrical current value to determine if there is a leakage is associated with the monitored device.

13. The testing device as claimed in claim 1, wherein said port control circuitry includes an impedance circuit to control electrical characteristics of the ports of said set of ports.

14. The testing device as claimed in claim 13, wherein said impedance circuit includes switches and a calibrated impedance element, said switches switching the calibrated impedance element in and out of a circuit path associated with a port to change an impedance characteristic of the port.

15. The testing device as claimed in claim 13, wherein said impedance circuit includes switches and a voltage source, said switches switching the voltage source in and out of a circuit path associated with a port to change an impedance characteristic of the port.

16. The testing device as claimed in claim 13, wherein said impedance circuit includes switches and a current source, said switches switching the current source in and out of a circuit path associated with a port to change an impedance characteristic of the port.

17. A method, using a testing device, for determining values of various electrical properties associated with a device within a process system, comprising:
 (a) providing, through ports, electrical communication with a device to be monitored;
 (b) automatically providing a connection configuration between a processing unit of the testing device and the device to be monitored, the connection configuration governing a flow of electrical signals, through ports, between the processing unit and the device to be monitored;
 (c) outputting an analog test signal;
 (d) receiving an analog return signal associated with a first port of the ports generated by the monitored device in response to the analog test signal; and
 (e) measuring an electrical property of the analog return signal associated with the first port of the ports and determining two properties associated with the monitored device based upon the measured electrical property of the analog return signal associated with the first port of the ports generated by the monitored device.

18. The method as claimed in claim 17, wherein the measuring of the electrical property of the analog return signal associated with the first port of the ports and determining of two properties associated with the monitored device based upon the analog return signals associated with the first port of the ports generated by the monitored device is substantially concurrent.

19. The method as claimed in claim 18, wherein the two properties are an electrical current value and a voltage value for the monitored device.

20. The method as claimed in claim 18, wherein the two properties are an electrical current value, an impedance value, and a voltage value for the monitored device.

21. The method as claimed in claim 18, wherein the two properties are a voltage amplitude value, an impedance value, and a voltage frequency value for the monitored device.

22. The method as claimed in claim 18, wherein the two properties are an AC voltage value and a DC voltage value for the monitored device.

23. The method as claimed in claim 18, wherein the two electrical properties are a voltage value and an impedance value for the monitored device.

24. The method as claimed in claim 18, wherein the two properties are an electrical current value and an impedance value for the monitored device.

25. The method as claimed in claim 18, wherein the two properties are a voltage value and a frequency value for the monitored device.

26. The method as claimed in claim 18, wherein the two properties are an electrical current value and a frequency value for the monitored device.

27. The method as claimed in claim 17, further comprising:
 (f) changing an impedance associated with a port;
 (g) measuring the electrical property of an analog return signal associated with the first port of the ports and determining a diagnostic electrical variable associated with the monitored device based upon the analog return signal associated with the first port of the ports generated by the monitored device when the impedance associated with the port is changed; and
 (h) comparing the diagnostic electrical variable with an electrical variable associated with the monitored device based upon an analog return signal associated with the first port of the ports generated by the monitored device when the impedance associated with the port is not changed to determine if there is a problem with the monitored device.

28. The method as claimed in claim 17, further comprising:
 (f) measuring the electrical property of an analog return signal associated with the first port of the ports and determining an electrical current value associated with the monitored device based upon the analog return signal associated with the first port of the ports generated by the monitored device when an impedance associated with a port is the first impedance;
 (g) changing an impedance associated with the port to a second impedance;
 (h) measuring the electrical property of an analog return signal associated with the first port of the ports and determining a diagnostic electrical current value associated with the monitored device based upon the analog return signal associated with the first port of the ports generated by the monitored device when the impedance associated with the port is the second impedance; and
 (i) comparing the diagnostic electrical current value with the electrical current value to determine if there is a leakage is associated with the monitored device.

29. The method as claimed in claim 17, further comprising:
 (f) controlling electrical impedance of the ports.

30. The method as claimed in claim 29, further comprising:
 (g) switching a calibrated impedance element in and out of a circuit path associated with a port to change an impedance characteristic of the port.

31. The method as claimed in claim 29, further comprising:
 (g) switching a voltage source in and out of a circuit path associated with a port to change an impedance characteristic of the port.

32. The method as claimed in claim 29, further comprising:
 (g) switching a current source in and out of a circuit path associated with a port to change an impedance characteristic of the port.

* * * * *